US 8,829,538 B2

(12) United States Patent
Cho (10) Patent No.: US 8,829,538 B2
(45) Date of Patent: Sep. 9, 2014

(54) LIGHT EMITTING DEVICE PACKAGE

(71) Applicant: LG Innotek Co., Ltd., Seoul (KR)

(72) Inventor: Bum Chul Cho, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 22 days.

(21) Appl. No.: 13/794,140

(22) Filed: Mar. 11, 2013

(65) Prior Publication Data

US 2013/0200335 A1     Aug. 8, 2013

Related U.S. Application Data

(63) Continuation of application No. 12/656,740, filed on Feb. 16, 2010, now Pat. No. 8,410,513.

(30) Foreign Application Priority Data

Feb. 17, 2009    (KR) .................. 10-2009-0013153

(51) Int. Cl.
*H01L 27/15*      (2006.01)

(52) U.S. Cl.
USPC .................. 257/81; 257/79; 257/98; 257/100

(58) Field of Classification Search
USPC ........................ 257/79, 81, 98, 100
See application file for complete search history.

(56) References Cited

U.S. PATENT DOCUMENTS

| 6,524,932 B1 | 2/2003 | Zhang et al. |
| 2005/0029535 A1 | 2/2005 | Mazzochette et al. |
| 2006/0118804 A1 | 6/2006 | Nagai et al. |
| 2007/0131953 A1 | 6/2007 | Shim |
| 2007/0200131 A1 | 8/2007 | Kim |
| 2007/0235743 A1 | 10/2007 | Lee et al. |
| 2008/0023710 A1 | 1/2008 | Park et al. |
| 2008/0023711 A1 | 1/2008 | Tarsa et al. |
| 2008/0149373 A1 | 6/2008 | Kim et al. |
| 2008/0164483 A1 | 7/2008 | Tomiyasu et al. |
| 2009/0026472 A1 | 1/2009 | Yasuda et al. |
| 2009/0109151 A1 | 4/2009 | Kim et al. |
| 2009/0278153 A1 | 11/2009 | Cho |
| 2010/0012967 A1 | 1/2010 | Choi et al. |
| 2010/0163905 A1* | 7/2010 | Kim ................................ 257/98 |

FOREIGN PATENT DOCUMENTS

| EP | 1 587 151 A2 | 10/2005 |
| EP | 1 826 834 A2 | 8/2007 |
| EP | 1 876 653 A2 | 1/2008 |
| EP | 1 890 340 A1 | 2/2008 |
| EP | 1 936 704 A2 | 6/2008 |
| EP | 1 937 041 A2 | 6/2008 |
| JP | 2008/016744 A | 8/2008 |

(Continued)

*Primary Examiner* — Jae Lee
(74) *Attorney, Agent, or Firm* — Birch, Stewart, Kolasch & Birch, LLP (57) ABSTRACT

Provided is a light emitting device package. The light emitting device package comprises a body formed of a silicon-based material; an insulating layer having a first opening on a surface of the body; a first and second metal layers disposed on the insulating layer; a light emitting device having a plurality of compound semiconductor layers disposed on a top surface of the body and connected to the first and second metal layers; and a protection device disposed on the body and electrically connected to the light emitting device, wherein the insulating layer has a second opening on a bottom surface of the body, wherein a first portion of the first metal layer is connected to the protective device and is disposed in the second opening of the insulating layer.

20 Claims, 6 Drawing Sheets

(56) References Cited

FOREIGN PATENT DOCUMENTS

| KR | 10-2006-0087048 A | 8/2006 |
|----|-------------------|--------|
| KR | 10-2006-0090466 A | 8/2006 |
| KR | 10-2008-0041816 A | 5/2008 |
| KR | 10-2008-0099090 A | 11/2008 |
| WO | WO 2008/078900 A1 | 7/2008 |

* cited by examiner

LIGHT EMITTING DEVICE PACKAGE

CROSS-REFERENCE TO RELATED APPLICATIONS

The present application is a Continuation of co-pending U.S. patent application Ser. No. 12/656,740 filed on Feb. 16, 2010, which claims priority under 35 U.S.C. 119 to Korean Patent Application No. 10-2009-0013153 (filed on Feb. 17, 2009), which is hereby incorporated by reference in its entirety.

BACKGROUND

Embodiments relate to a light emitting device package.

Light emitting diodes (LEDs) may form light emitting sources using GaAs-based, AlGaAs-based, GaN-based, InGaN-based, and InGaAlP-based compound semiconductor materials.

Such LEDs are packaged to be used as light emitting devices that emit a variety of colors. Light emitting diodes are used as light sources in diverse applications, including on/off indicators, text displays, and image displays, that depict colors.

SUMMARY

Embodiments provide a light emitting device package in which a light emitting device is grown on a conductive type package body.

Embodiments provide a light emitting device package in which current is supplied to a light emitting device through a package body.

Embodiments provide a light emitting device package in which heat generated from a light emitting device is emitted through a package body.

Embodiments provide a light emitting device package comprising a plurality of wells disposed on a package body.

An embodiment provides a light emitting device package comprising: a body formed of a silicon-based material; an insulating layer having a first opening on a surface of the body; a first and second metal layers disposed on the insulating layer; a light emitting device having a plurality of compound semiconductor layers disposed on a top surface of the body and connected to the first and second metal layers; and a protection device disposed on the body and electrically connected to the light emitting device, wherein the insulating layer has a second opening on a bottom surface of the body, wherein a first portion of the first metal layer is connected to the protective device and is disposed in the second opening of the insulating layer, wherein the light emitting device is directly contacted with the top surface of the body, wherein one of the first and second metal layers is directly contacted with the body.

An embodiment provides a light emitting device package comprising: a body formed of a silicon-based material and having a cavity; an insulating layer having a first opening on a surface of the body; a first and second metal layers disposed on the insulating layer; a light emitting device having a plurality of compound semiconductor layers disposed in the cavity of the body and connected to the first and second metal layers; and a protection device disposed on the body and electrically connected to the light emitting device, wherein the insulating layer has a second opening on a bottom surface of the body, wherein a first portion of the first metal layer is connected to the protective device and is disposed in the second opening of the insulating layer, wherein the light emitting device is directly contacted with the top surface of the body, wherein one of the first and second metal layers is directly contacted with the body.

The details of one or more embodiments are set forth in the accompanying drawings and the description below. Other features will be apparent from the description and drawings, and from the claims.

DETAILED DESCRIPTION OF THE EMBODIMENTS

In the following description, it will be understood that when a layer (or film) is referred to as being 'on' another layer or substrate, it can be directly on the another layer or substrate, or intervening layers may also be present. Further, it will be understood that when a layer is referred to as being 'under' another layer, it can be directly under the another layer, and one or more intervening layers may also be present. Reference will now be made in detail to the embodiments of the present disclosure, examples of which are illustrated in the accompanying drawings. In the following description, words "above," "one," "below," and "underneath" are based on the accompanying drawings. In addition, a thickness of each layer is only exemplarily illustrated.

Figure 1:
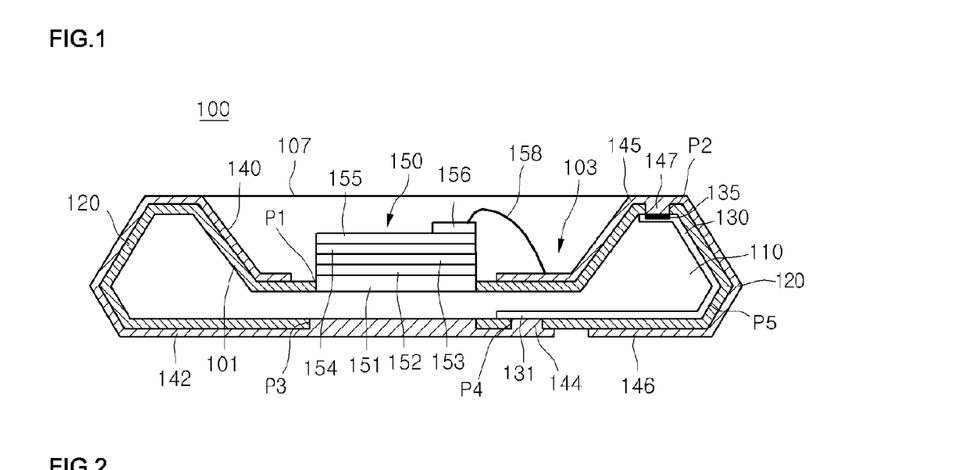
FIG. 1 is a side sectional view of a light emitting device package according to an embodiment.

FIG. 1 is a side sectional view of a light emitting device package according to an embodiment.

Referring to FIG. 1, a light emitting device package 100 includes a package body 110, an insulating layer 120, a first wall 130, a second wall 135, a first metal layer 140, a second metal layer 145, and a light emitting device 150.

The package body 110 may be a conductive body, e.g., a wafer level package (WLP) using a conductive substrate formed of a silicon material. A cavity 103 having a predetermined depth is defined in an upper portion of the package body 110. The cavity 103 may have any one of a base tube type of groove, a polygonal groove and a circular groove. The groove shapes may be realized into a single structure or a multi-layered stair structure but is not limited thereto.

The package body 110 may have a first conductive characteristic. Here, the first conductive characteristic represents a region in which a first conductive type dopant is injected or diffused.

Also, the package body 110 may have the same polarity as a conductive type buffer layer 151, but is not limited thereto.

The cavity 103 may have a lateral surface 101 vertically disposed or inclined with respect to a bottom surface of the package body 110. Also, the lateral surface 101 of the cavity 103 may be inclined as a predetermined angle or curvature.

The insulating layer 120 is disposed on a surface of the package body 110. The insulating layer 120 may be formed of one selected from various insulating materials such as silicon oxide (for example, $SiO_2$), silicon thermal oxide, aluminum nitride (AlN), silicon carbide (SiC), alumina, and silicon
} nitride, dielectric materials, but is not limited thereto. Here, the insulating layer 120 may be formed of, for example, silicon thermal oxide that effectively realizes a Zener diode structure.

For example, a thickness from a bottom surface of the cavity 103 to the bottom surface of the package body 110 may range from about 500 um to about 2,000 um. This thickness represents a range in which heat is effectively transferred without breaking out of the silicon substrate. However, this embodiment is not limited to the thickness of the silicon substrate.

The insulating layer 120 is disposed on the surface of the package body 110. The insulating layer 120 may not be disposed on a portion of the surface of the package body 110. The insulating layer 120 has a plurality of openings P1 to P5. The first opening P1 may be defined in the bottom surface of the cavity 103, the second opening P2 may be defined in a portion of the second wall 135, the third opening P3 may be defined in a portion of the bottom surface of the package body 110, and the fourth opening P4 may be defined in a portion of the first wall 130, but are not limited thereto.

At least portion of the first opening P1 and the third opening P3 of the insulating layer 120 may be vertically disposed on both surfaces of the package body 110 to overlap each other.

One or more wells for realizing a transistor TFT and Zener diode may be defined in a predetermined region of the package body 110. The wells may have polarities equal or opposite to that of the package body 110. Hereinafter, this embodiment will describe a structure for realizing the Zener diode as an example.

The first well 130 may be defined in a predetermined region of the package body 110. A material having a polarity opposite to that of the package body 110, for example, a second conductive type dopant is injected or diffused in a first well region of the package body 110 to define the first well 130. The first well 130 may have a predetermined size in a predetermined region of the package body 110, but is not limited thereto.

The first conductive type dopant is injected or diffused in a portion of the first well 130 to define the second well 135. This embodiment is not limited to a position and number of the second well 135.

The first well 130 connects the package body 110 to the second well 135, and the second well 135 connects the first well 130 to the second metal layer 145.

The first well 130 and the second well 135 may be realized as the Zener diode and electrically connected to the light emitting device 150. Although the Zener diode is disposed in a side region of the package body 110 in this embodiment, the Zener diode may be disposed in either side regions or a lower region. Here, this embodiment is not limited to positions and number of the wells.

The first and second metal layers 140 and 145 are disposed on the insulating layer 120. The first and second metal layers 140 and 145 respectively have predetermined patterns and are electrically isolated from each other. The first metal layer 140 is disposed at one side of the package body 110 with respect to the light emitting device 150. The second metal layer 145 is disposed at the other side of the package body 110 with respect to the light emitting device 150. One ends of the first and second layers 140 and 145 extend toward the cavity 103, and the other ends of the first and second layers 140 and 145 extend up to the bottom surface of the package body 110.

The first and second metal layers 140 and 145 may have a single layer structure or a multi-layered structure using at least one of metal materials such as Cu, Ni, Au, and Ti, but are not limited thereto. The first and second metal layers 140 and 145 may serve as at least two electrode leads. The number of leads may be varied according to the pattern configuration of the metal layers.

A body contact part 143 and a first well contact part 144 are disposed on the other side 142 of the first metal layer 140. The body contact part 143 contacts the package body 110 through the third opening P3 of the insulating layer 120. The body contact part 143 vertically overlaps the light emitting device 150 at a lower portion of the package body 110. The first contact part 144 contacts the first well 130 through the fourth opening P4 of the insulating layer 120.

The other side 146 of the second metal layer 145 contacts the second well 135 through the second opening P2 of the insulating layer 120.

The light emitting device 150 is disposed in the cavity 103 of the package body 110. The package body 110 is used as a substrate for growing. A semiconductor layer of the light emitting device 150 is disposed on the package body 110 the first opening P1 defined in the bottom surface of the cavity 103.

In the light emitting device 150, the conductive type buffer layer 151, a first conductive type semiconductor layer 152, an active layer 153, and a second conductive type semiconductor layer 154 are disposed on the package body 110.

The first metal layer 140 is electrically connected to the conductive type buffer layer 151 of the light emitting device 150 through the package body 110. The second metal layer 145 is connected to the light emitting device 150 using a wire 158.

Figure 2:
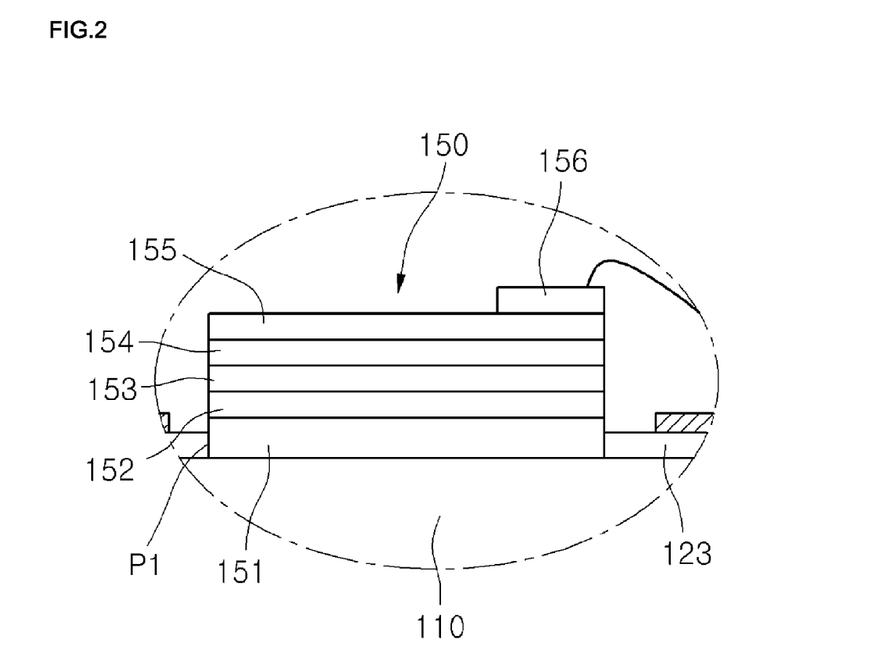
FIG. 2 is an enlarged view illustrating a light emitting device region of FIG. 1.

Referring to FIGS. 1 and 2, the light emitting device 150 includes the conductive type buffer layer 151, the first conductive type semiconductor layer 152, the active layer 153, the second conductive type semiconductor layer 154, a transparent electrode layer 155, and an electrode 156.

The conductive type buffer layer 151 is disposed on the package body 110. The conductive type buffer layer 151 is disposed on the bottom surface of the cavity 103. Also, the conductive type buffer layer 151 is disposed on the package body 110 exposed through the first opening P1 of the insulating layer 120.

The conductive type buffer layer 151 may be formed of a Group III-V compound semiconductor doped with the first conductive type dopant, for example, one selected from the group consisting of GaN, InN, AlN, InGaN, AlGaN, InAlGaN, and AlInN. Also, the conductive type buffer layer 151 may be formed of conductive oxide of Group II to VI compounds, for example, $ZnO_x$. The conductive type buffer layer 151 may have a single layer structure or a multi-layered structure.

The conductive type buffer layer 151 may have a size equal to that of the first opening P1.

The first conductive type semiconductor layer 152 is disposed on the conductive type buffer layer 151. The first conductive type semiconductor layer 152 may be realized as a semiconductor material having the composition equation of $In_xAl_yGa_{1-x-y}N$ (where $0 \leq x \leq 1$, $0 \leq y \leq 1$, and $0 \leq x+y \leq 1$). Also, the first conductive type semiconductor layer 152 is doped with the first conductive type dopant. For example, the first conductive type semiconductor layer 152 may be formed of one selected from the group consisting of GaN, InN, AlN, InGaN, AlGaN, InAlGaN, and AlInN, which are formed by combination of Group III elements and Group VI elements. When the first conductive type semiconductor layer 152 is an N-type semiconductor layer, the first conductive type dopant is an N-type dopant. The N-type dopant includes Si, Ge, Sn, and the like.

The first conductive type semiconductor layer 152 may have the same size as the conductive type buffer layer 151 and be disposed on the conductive type buffer layer 151.

The active layer 153 is disposed on the first conductive type semiconductor layer 152. The active layer 153 has a single quantum well structure or a multi-quantum well structure. The active layer 153 may have a cycle of a well layer and a barrier layer, for example, cycle of a InGaN well layer/GaN barrier layer or a cycle of an AlGaN well layer/GaN barrier layer using compound semiconductor materials of Group III elements and Group V elements.

The active layer 153 is formed of a material having a band gap energy according to a wavelength of emitted light. For example, in case of blue light emission having a wavelength of about 440 nm to about 460 nm, the active layer 153 may have the single or multi quantum well structure having the cycle of the a InGaN well layer/GaN barrier layer. The active layer 153 may be formed of a material emitting colored light such as light having a blue wavelength, light having a red wavelength, and light having a green wavelength. The active layer 153 may emit light having an UV wavelength. A conductive clad layer (not shown) may be disposed on and/or under the active layer 153. The conductive clad layer may be realized as an AlGaN layer.

The second conductive type semiconductor layer 154 is disposed on the active layer 153. The second conductive type semiconductor layer 153 may be realized as a semiconductor material having the composition equation of $In_xAl_yGa_{1-x-y}N$ (where $0 \leq x \leq 1$, $0 \leq y \leq 1$, and $0 \leq x+y \leq 1$). Also, the second conductive type semiconductor layer 154 is doped with the second conductive type dopant. For example, the second conductive type semiconductor layer 154 may be formed of one selected from the group consisting of GaN, InN, AlN, InGaN, AlGaN, InAlGaN, and AlInN, which are formed by combination of Group III elements and Group V elements. When the second conductive type semiconductor layer 154 is a P-type semiconductor layer, the second conductive type dopant is a P-type dopant. The P-type dopant includes Mg, Zn, Ca, Sr, Ba, and the like.

A third conductive type semiconductor layer (not shown) may be disposed on the second conductive type semiconductor layer 154. The third conductive type semiconductor layer may have a polarity opposite to that of the second conductive type semiconductor layer 154.

Other semiconductor layers or structures may be disposed between the first conductive type semiconductor layer 152, the active layer 153, and the second conductive type semiconductor layer 154 or inside each of the first conductive type semiconductor layer 152, the active layer 153, and the second conductive type semiconductor layer 154, but is not limited thereto. The first conductive type semiconductor layer 152, the active layer 153, and the second conductive type semiconductor layer 154 may have the same size as that of the conductive type buffer layer 151. Here, the size of each of the layers may represent an area of an interface contacting a top surface or a bottom surface of each of the layer.

The first conductive type semiconductor layer 152, the active layer 153, and the second conductive type semiconductor layer 154 may be defined as a light emitting structure. The light emitting structure may have a P-N junction structure, an N-P junction structure, or an N-P-N junction structure within a technical scope of this embodiment.

The transparent electrode layer 155 may be disposed on the second conductive type semiconductor layer 154. The transparent electrode layer 155 may be formed of at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO. An electrode 156 is disposed on the transparent electrode layer 155. The electrode 156 may be formed of at least one or two or more compounds of Cr, Ag, Ag alloy, Ni, Al, Al alloy, Rh, Pd, Ir, Ru, Mg, Zn, Pt, Au, and Hf. Also, the electrode 156 may have a single layer structure or a multi-layered structure. The electrode 156 may directly or indirectly contact the transparent electrode layer 155 and/or the second conductive type semiconductor layer 154, but is not limited thereto.

The electrode 156 of the light emitting device 150 may be electrically connected to the second metal layer 145 using a wire 158.

A transparent resin material 107 such as silicon or epoxy may be disposed in the cavity 103. A phosphor may be added to the resin material 107. A lens (e.g., a convex lens) may be attached or molded on the resin material 107.

The first and second metal layers 140 and 145 of the light emitting device package 100 may be mounted on a substrate. For example, the substrate may be mounted on a ceramic substrate, a metal core printed circuit board (MCPCB), or a flexible substrate. The first and second metal layers 140 and 145 may be mounted by a solder-bonding using a surface-mount technology (SMT).

The light emitting device 150 receives a power through the first and second metal layers 140 and 145. Carriers supplied to the second metal layer 145 are supplied to channels of the wire 158, the second electrode 156, the transparent electrode layer 155, and the second conductive type semiconductor layer 154. Carriers supplied to the first metal layer 140 are supplied to channels of the package body 110, the conductive type buffer layer 151, and the first conductive type semiconductor layer 152.

When the active layer 153 emits light, the emitted light is emitted in all directions. The first and second metal layers 140 and 145 disposed on a lateral surface 101 of the cavity 103 reflect the incident light. At this time, the body contact part 143 of the first metal layer 140 contacts a bottom surface of the package body 110 at a predetermined area. Thus, the body contact part 143 may be electrically connected to the package body 110 to effectively emit heat transferred to the package body 110.

The first and second wells 130 and 135 are connected to the light emitting device 150 in parallel in terms of a circuit structure. Thus, the first and second wells 130 and 135 protect the light emitting device 150 from an abnormal voltage (e.g., ESD) applicable to the light emitting device 150.

FIGS. 3 to 10 are views illustrating a process of manufacturing a light emitting device package of FIG. 1. FIG. 11 is a flowchart illustrating a process of manufacturing a light emitting device package of FIG. 1.

Figure 3:
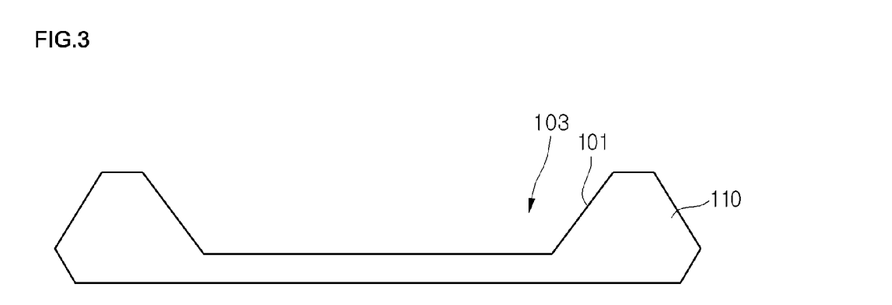
FIGS. 3 to 10 are views illustrating a process of manufacturing a light emitting device package of FIG. 1.
Figure 4:
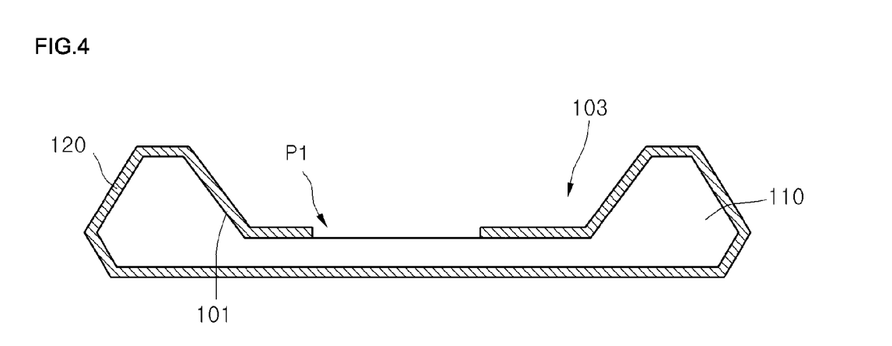

Referring to FIGS. 3 and 4, a cavity 103 is formed in an upper portion of a package body 110 (see operation S101 of FIG. 11). The package body 110 may have a first conductive characteristic. Alternatively, a first type dopant may be injected or diffused to form the package body 110. The cavity 103 may be formed through an etch process, e.g., a wet and/or dry etch process. Also, the cavity 103 may not be formed.

An insulating layer 120 is formed on a surface of the package body 110 (see operation S102 of FIG. 11). A first opening P1 of the insulating layer 120 may be opened by patterning through a photoresist process. The first opening P1 may be an LED region. A top surface of the package body 110 disposed on a bottom surface of the cavity 103 is exposed (see operation S103 of FIG. 11). Here, a region except the first opening P1 of the insulating layer 120 may be formed by masking using a mask pattern and etching.

Figure 5:
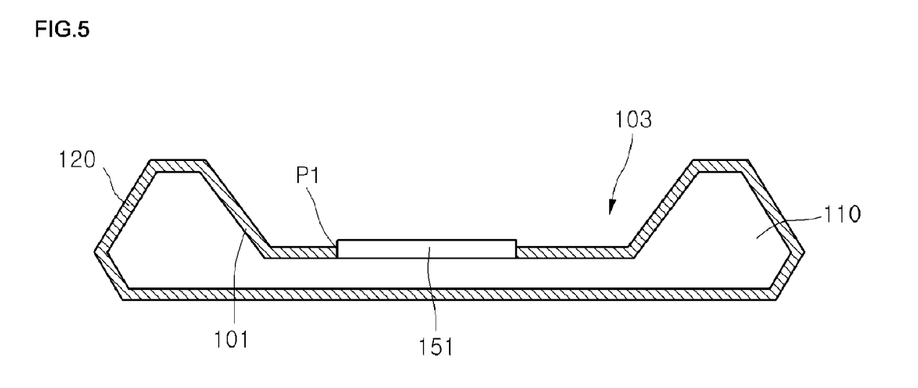
Figure 6:
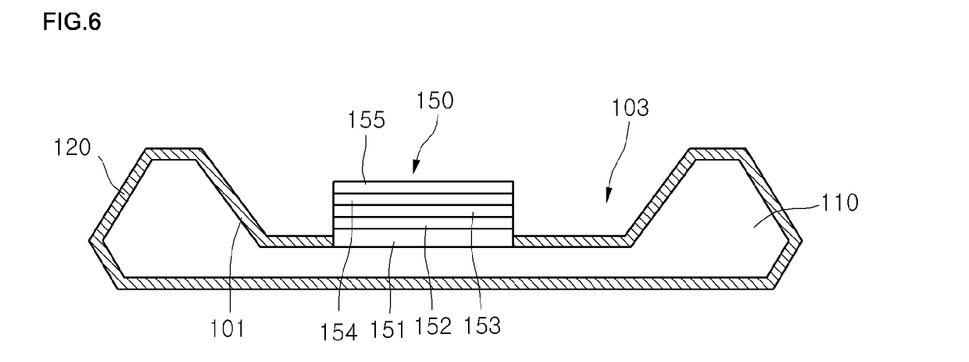

Referring to FIGS. 4 to 6, when the first opening P1 of the insulating layer 120 is formed, a compound semiconductor layer is formed on the package body 110 exposed through the first opening P1 (see operation 104 of FIG. 11). A conductive type buffer layer 151, a first conductive type semiconductor layer 152, an active layer 153, and a second conductive type semiconductor layer 154 are sequentially grown using Group II to VI compound semiconductor materials within a growth equipment.

The growth equipment may include an E-beam evaporator, physical vapor deposition (PVD), chemical vapor deposition (CVD), plasma laser deposition (PLD), a dual-type thermal evaporator, sputtering, or metal organic chemical vapor deposition (MOCVD), but is not limited thereto.

The conductive type buffer layer 151 may be formed of the Group II to VI compound semiconductor materials. The conductive type buffer layer 151 may be formed of a Group III-V compound semiconductor material, to which a first conductive type dopant is doped, for example, one of GaN, InN, AlN, InGaN, AlGaN, InAlGaN, and AlInN. The first conductive type dopant includes a Group IV elements such as Si. When the conductive type buffer layer 151 is a GaN buffer layer, gas containing an N-type dopant such as $NH_3$, TMGa, and Si may be supplied to form the conductive type buffer layer 151. Alternatively, the conductive type buffer layer 151 may be formed of a material that is an oxide-based material and has a conductive characteristic.

The first conductive type semiconductor layer 152, the active layer 153, and the second conductive type semiconductor layer 154 are sequentially formed on the conductive type buffer layer 151. A specific growth method of each of the layers may be easily applied according to the embodiment by those skilled in the art. Also, the first conductive type semiconductor layer 152 may be an N-type semiconductor layer, and the second conductive type semiconductor layer 154 may be a P-type semiconductor layer. On the other hand, the first conductive type semiconductor layer 152 may be a P-type semiconductor layer, and the second conductive type semiconductor layer 154 may be an N-type semiconductor layer. Also, a semiconductor layer having a polarity opposite to that of the second conductive type semiconductor layer 154 may further formed on the second conductive type semiconductor layer 154, but is not limited thereto. An N-type dopant is doped into a Group III-V compound semiconductor to form the N-type semiconductor layer. A P-type dopant is doped into the III-V compound semiconductor to form the P-type semiconductor layer.

A transparent electrode layer 155 may be formed on the second conductive type semiconductor layer 154. The transparent electrode layer 155 may be formed of at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO. Here, the transparent electrode layer 155 may be formed when a metal layer is formed, but is not limited thereto.

Figure 7:
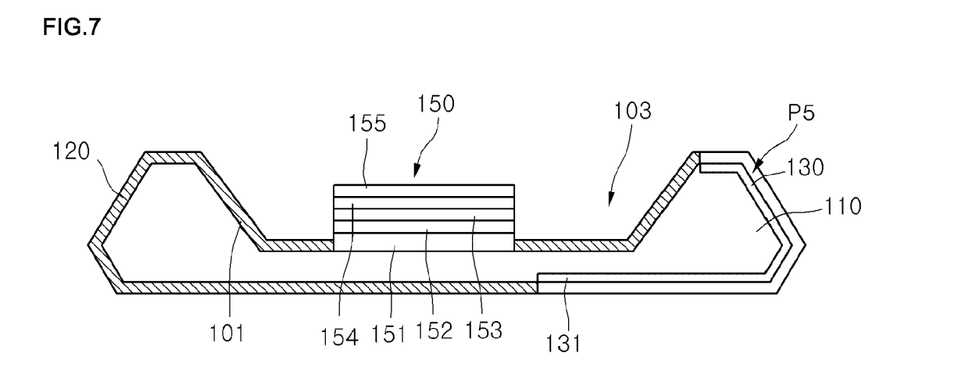
Figure 8:
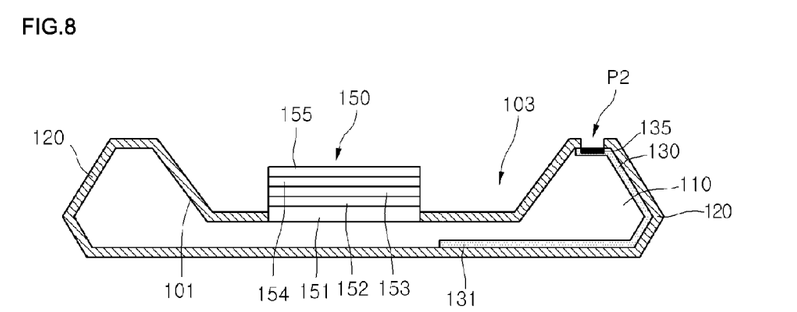

Referring to FIGS. 7 and 8, a fifth opening P5 of the insulating layer 120 is patterned to expose the package body 110. That is, the package body 110 is exposed through the fifth opening P5. A first ion is injected into the exposed package body 110 to form a first well 130 (see operations S105 and S106 of FIG. 11). The first ion may include the first conductive type dopant.

The fifth opening P5 is covered again by a material forming the insulating layer 120. Here, a portion of the fifth opening P5 may be used as a second opening P2. The second opening P2 may be formed by patterning the insulating layer 120 or uses an exposed portion of the fifth opening P5.

A second ion having a polarity opposite to that of the first ion is injected through the second opening P2 to form a second well 135 (see operations S107 and S108 of FIG. 11). The second well 135 may be formed at a portion of the first well 130 and connected to the package body 110 through the first well 130.

Figure 9:
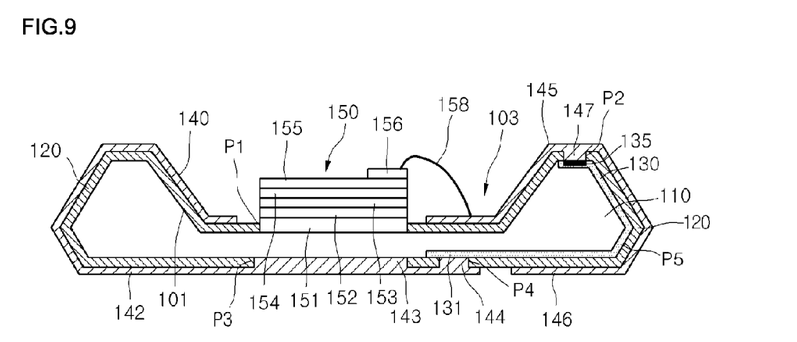
Figure 10:
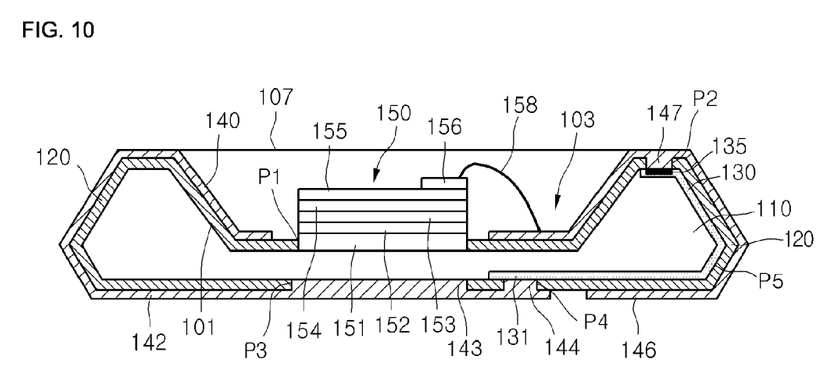
Figure 11:
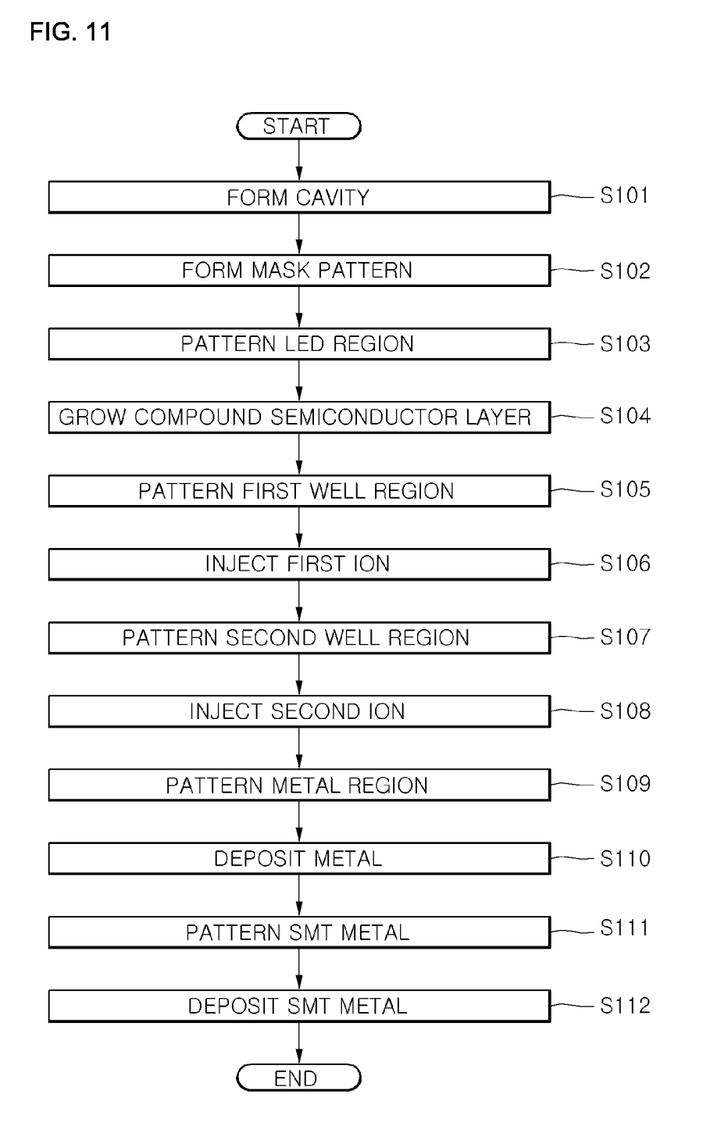
FIG. 11 is a flowchart illustrating a process of manufacturing a light emitting device package of FIG. 1.

Referring to FIGS. 9 and 10, a metal region such as a metal layer and an electrode is patterned to deposit a metal (see operation S109 and S110 of FIG. 11). An electrode 156 is deposited on the transparent electrode layer 155. Here, the transparent electrode layer 155 may be formed before the electrode 156 is formed, but is not limited thereto.

Here, the electrode 156 may be formed into a single layer structure or a multi-layered structure using at least one of Cr, Ag, Ag alloy, Ni, Al, Al alloy, Rh, Pd, Ir, Ru, Mg, Zn, Pt, Au, and Hf.

A patterning process is performed on the insulating layer 120 to form third and fourth openings P3 and P4. In the patterning process, a region except the opening region is masked using a mask pattern to form the third and fourth opening P3 and P4.

First and second metal layers 140 and 145 are formed on the insulating layer 120. The first and second metal layers 140 and 145 may be formed of one selected from the group consisting of Ti, Cu, Ni, and Au using a sputtering apparatus or a plating process. The first and second metal layers 140 and 145 are electrically isolated from each other.

The first metal layer 140 extends up to a side of the cavity, a side of a bottom surface of the package body 110, and a portion of a bottom surface of the package body 110. The other side 142 of the first metal layer 140 is disposed on the bottom surface of the package body 110. The first metal layer 140 contacts the package body 110 and the first well 144. That is, a body contact part 143 of the first metal layer 140 contacts the package body 110 through the third opening P3 of the insulating layer 120. A first well contact part 144 contacts the first well 130 through the fourth opening P4 of the insulating layer 120.

The second metal layer 145 extends up to the other side of the cavity, the other side of the package body 110, and a portion of the bottom surface of the package body 110. The second metal layer 145 is formed on the second well 135 through the second opening P2 of the insulating layer 120. A second well contact part 146 of the second metal layer 145 electrically contacts the second well 135.

The other sides 142 and 146 of the first and second metal layers 140 and 145 may serve as a metal for a surface-mount technology (SMT). Here, the other side 142 of the first metal layer 140 may have a size 1.5 times greater than that of the other side 146 of the second metal layer 145.

The electrode 156 of the light emitting device 150 may be connected to the second electrode layer 145 through a connection member, i.e., the wire 158.

A resin material 117 is formed in the cavity 103. The resin material 117 may include a resin-based material such as silicon or epoxy. A phosphor may be added to the resin material 107. A lens may be formed on the resin material 117.

Thereafter, when a packaging process of the light emitting device 150 is completed, a dicing process may be performed for each of the packages.

Figure 12:
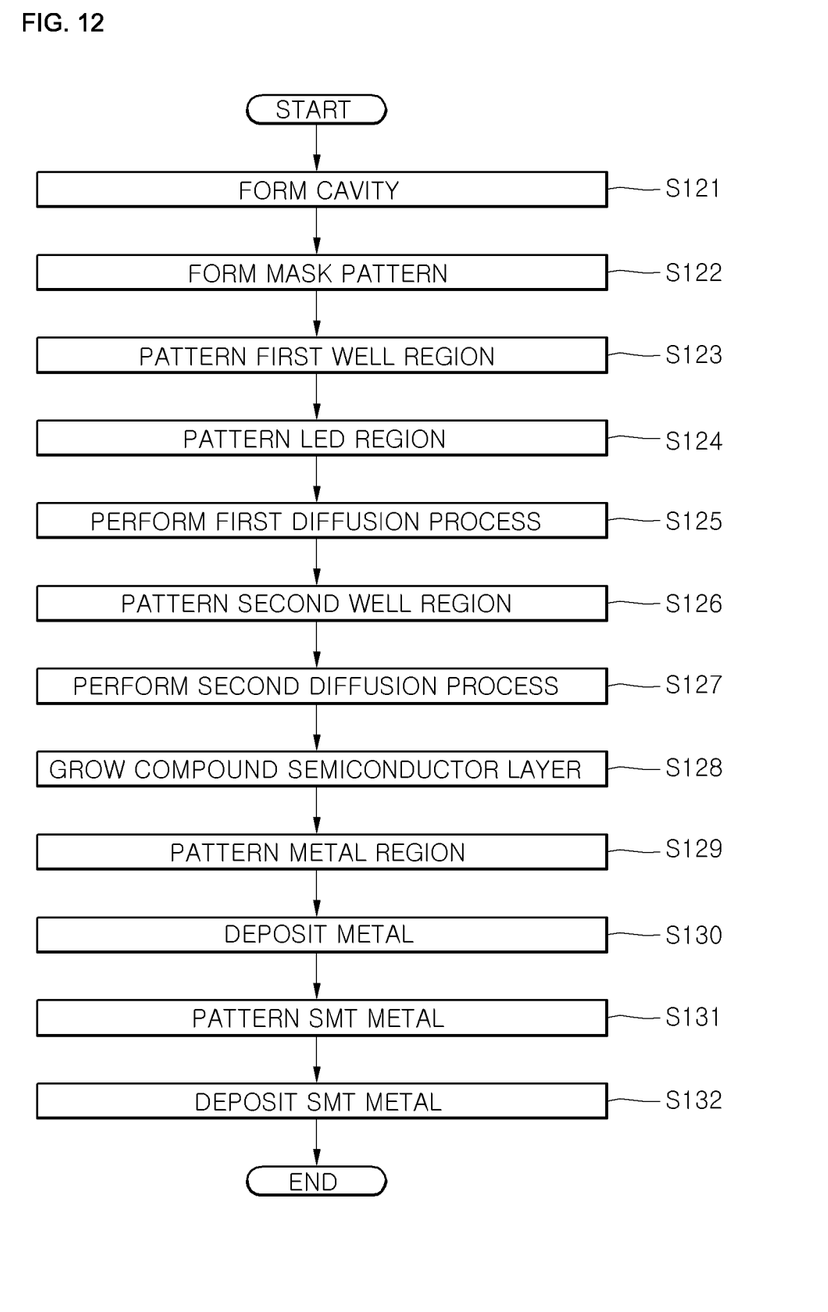
FIG. 12 is a flowchart illustrating a process of manufacturing a light emitting device package according to another embodiment.

FIG. 12 is a flowchart illustrating a process of manufacturing a light emitting device package according to another embodiment. In description of FIG. 12, the components of FIG. 1 will be cited, and their duplicated descriptions will be omitted.

Referring to FIGS. 12 and 1, a cavity 103 may be formed at an upper portion of a package body 119 in operation S121). The cavity may not be formed, but is not limited thereto.

In operation S122, an insulating layer 120 is formed on a surface of the package body 110. Here, the insulating layer 120 may be formed on a portion of the surface or an entire surface of the package body, but is not limited thereto.

In operation S123, a first well region of the insulating layer 120 is patterned. In operation S124, the device (LED) region is patterned. Here, the patterning processes of the first well region and the device region may be changed in sequence.

Thereafter, a first diffusion process is performed to diffuse a first ion into the first well region of the package body 110 in operation S125. In operation S127, a second well region of the first well region is patterned to diffuse a second ion in the second well region of the package body 110 through a second diffusion process. Here, the first ion includes a first conductive type dopant, and the second ion includes a second conductive type dopant.

In operation S128, an LED epitaxial layer serving as a compound semiconductor layer is formed in the device (LED) deformation region. A conductive type buffer layer 151, a first conductive type semiconductor layer 152, an active layer 153, and a second conductive type semiconductor layer 154 are sequentially grown using Group II to VI compound semiconductor materials within a growth equipment (e.g., PEMICVD) to form the LED epitaxial layer.

Thereafter, the metal region is patterned to deposit a metal in operations S129 and S130. A transparent electrode layer 155 is formed on the compound semiconductor layer, and an electrode 156 is deposited on the transparent electrode layer 155.

In operations S131 and S132, a SMT metal region defined on the package body 110 is patterned to form a SMT metal, e.g., a first metal layer and a second metal layer.

Thereafter, a wire bonding process is performed on the light emitting device 150, and then, a resin material is formed in the cavity region.

A method of manufacturing the light emitting device package includes: forming an insulating layer on a surface of a first conductive type package body; patterning a first region defined on the package body to form a conductive type buffer layer; forming a light emitting structure including a Group III-V compound semiconductor layer on the conductive type buffer layer; forming a first electrode on the light emitting structure, patterning a lower portion of the package body to form a first metal layer; and forming a second metal layer on the other side of the insulating layer.

According to the embodiments, since the light emitting device is directly grown on the conductive type package body, a current characteristic of the light emitting device may be improved.

In the light emitting device package according to the embodiments, since the plurality of compound semiconductor layer is directly grown on the package body and packaged, the manufacturing process of the light emitting device package may be improved. Also, a growth substrate such as a sapphire substrate may not be used. The embodiments improve a heatsink characteristic and an ESD characteristic of the light emitting device.

Another embodiment provides a lighting system which comprises the light emitting device described above. The lighting system may include lamp, street light, light unit not limited thereto.

The light emitting device package according to the embodiments may be used as light sources in various fields such as light display devices, indicating devices, lighting devices, alphanumeric display devices, and image display devices.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body formed of a silicon-based material;
an insulating layer having a first opening on a surface of the body;
a first and second metal layers disposed on the insulating layer;
a light emitting device having a plurality of compound semiconductor layers disposed on a top surface of the body and connected to the first and second metal layers; and
a protection device disposed on the body and electrically connected to at least one of the light emitting device and the body,
wherein the insulating layer has a second opening on the body,
wherein a first portion of the first metal layer is connected to the protective device and is disposed in the second opening of the insulating layer,
wherein the light emitting device is directly contacted with the top surface of the body.

2. The light emitting device according to claim 1, wherein the body includes a conductive dopant.

3. The light emitting device according to claim 1, wherein the light emitting device includes an electrode connected to the second metal layer.

4. The light emitting device according to claim 1, wherein the insulating layer includes a third opening and a second portion of the first metal layer is disposed in the third opening of the insulating layer.

5. The light emitting device according to claim 4, wherein the second portion of the first metal layer corresponds to a bottom surface of the light emitting device.

6. The light emitting device according to claim 1, wherein the body is electrically connected to the body.

7. The light emitting device according to claim 1, further comprising a transparent resin material on the light emitting device.

8. The light emitting device according to claim 7, wherein the transparent resin material includes a phosphor.

9. The light emitting device according to claim 1, wherein the body has a thickness of range from about 500 μm to about 2000 μm.

10. The light emitting device according to claim 1, wherein the insulating layer has a fourth opening and the protection device disposed into the fourth opening of the insulating layer.

11. The light emitting device according to claim 1, wherein one of the first and second metal layers is directly contacted with the body.

12. A light emitting device package comprising:
a body formed of a silicon-based material and having a cavity;
an insulating layer having a first opening on a surface of the body;
a first and second metal layers disposed on the insulating layer;
a light emitting device having a plurality of compound semiconductor layers disposed in the cavity of the body and connected to the first and second metal layers; and
a protection device disposed on the body and electrically connected to the light emitting device,
wherein the insulating layer has a second opening on a bottom surface of the body,
wherein a first portion of the first metal layer is connected to the protective device and is disposed in the second opening of the insulating layer,
wherein the light emitting device is directly contacted with the top surface of the body,
wherein one of the first and second metal layers is directly contacted with the body.

13. The light emitting device according to claim 12, wherein the body includes a conductive dopant.

14. The light emitting device according to claim 12, wherein the light emitting device includes an electrode connected to the second metal layer in the cavity.

15. The light emitting device according to claim 12, wherein the insulating layer includes a third opening on a bottom surface of the body and a second portion of the first metal layer is disposed in the third opening of the insulating layer.

16. The light emitting device according to claim 15, wherein the second portion of the first metal layer corresponds to a bottom surface of the light emitting device.

17. The light emitting device according to claim 12, wherein the body is electrically connected to the body.

18. The light emitting device according to claim 12, wherein the first and second metal layers are extended on a bottom surface of the body.

19. The light emitting device according to claim 12, wherein a thickness between a bottom surface of the cavity and the bottom surface of the body has range from about 500 μm to about 2000 μm.

20. The light emitting device according to claim 12, wherein the insulating layer has a fourth opening and the protection device disposed into the fourth opening of the insulating layer.

* * * * *